United States Patent [19]
Shyu

[11] Patent Number: 6,046,957
[45] Date of Patent: Apr. 4, 2000

[54] SEMICONDUCTOR MEMORY DEVICE WITH FLEXIBLE CONFIGURATION

[75] Inventor: Rong-Fuh Shyu, Hsinchu, Taiwan

[73] Assignee: Winbond Electronics Corporation, Taiwan

[21] Appl. No.: 09/384,045

[22] Filed: Aug. 26, 1999

[51] Int. Cl.$^7$ .................................................. G11C 8/00
[52] U.S. Cl. ............................... 365/230.06; 365/230.01
[58] Field of Search ......................... 365/230.06, 230.01, 365/230.03, 230.08

[56] References Cited

U.S. PATENT DOCUMENTS

| | | | |
|---|---|---|---|
| 5,307,320 | 4/1994 | Farrer et al. | 365/230.01 |
| 5,406,525 | 4/1995 | Nicholes | 365/230.02 |
| 5,572,482 | 11/1996 | Hoshizaki et al. | 365/233 |
| 5,801,547 | 9/1998 | Kean | 326/40 |
| 5,978,304 | 11/1999 | Crafts | 365/230.03 |

*Primary Examiner*—Son Mai
*Attorney, Agent, or Firm*—Fish & Richardson P.C.

[57] ABSTRACT

A semiconductor memory device includes an M-by-N memory array having a number M of complete words, each of the complete words having a number N of bits. The memory array further has M word lines to address the M complete words, and N bit lines to access the N bits. The number N has a number p of integer factors. The memory array can be configured to operate in p different operating modes, where the bits of the complete words are rearranged into at least one sub-word formed as a bit group. An auxiliary address decoder, a mode selector, an auxiliary address router and an input data router cooperate with an input buffer portion of an input/output circuit to enable routing of input data bits from input data lines of an input data bus to a selected sub-word of the memory array. The auxiliary address decoder, the mode selector and an output data router cooperate with an output sense amplifier portion of the input/output circuit to route output data bits of the selected sub-word of the memory array to output data lines of an output data bus.

15 Claims, 5 Drawing Sheets

SEMICONDUCTOR MEMORY DEVICE WITH FLEXIBLE CONFIGURATION

BACKGROUND OF THE INVENTION

1. Field of the Invention

The invention relates to a semiconductor memory device, more particularly to one having a flexible configuration.

2. Description of the Related Art

With the growing trend toward SOC (system-on-a-chip) technology, it is inevitable to incorporate a variety of circuit building blocks, each performing a specific function of an electronic system, onto a single integrated circuit chip. This trend imposes a great burden on traditional VLSI circuit design techniques due to the fact that VLSI designers no longer start the circuit design from scratch. Instead, an IP (intellectual property) based design approach is performed. The IP-based design approach involves the use of circuit building blocks having specific functions that are well proven for the integration of the system chip.

Memory devices are usually needed in a system chip. Generally, many memory macros will be embedded within the system chip that commands these memories. The embedded memory macros may be volatile, such as SRAM and DRAM, or non-volatile, such as mask ROM, EPROM, EEPROM and flash memory, and can have parts that differ much in configuration from the standard stand-alone memory devices.

Reusability is a key factor in a design involving the SOC methodology. It can reduce the development time and thus shorten the time to market a product. A circuit building block with a specific fixed function can be reused for a variety of system chips, although some minor differences might exist for fitting the circuit building block into different circuit designs. As a necessary building block in a system chip, it is desirable for a memory device to have a flexible configuration so as to be adapted for use in a wide range of different system chips without the need for constructing a different memory macro for each chip. Although the memory device with the flexible configuration is motivated largely by its embedded utilization in a system chip, it can also be fabricated as a stand-alone chip to provide a flexible configuration in the design of a system board.

Figure 1:
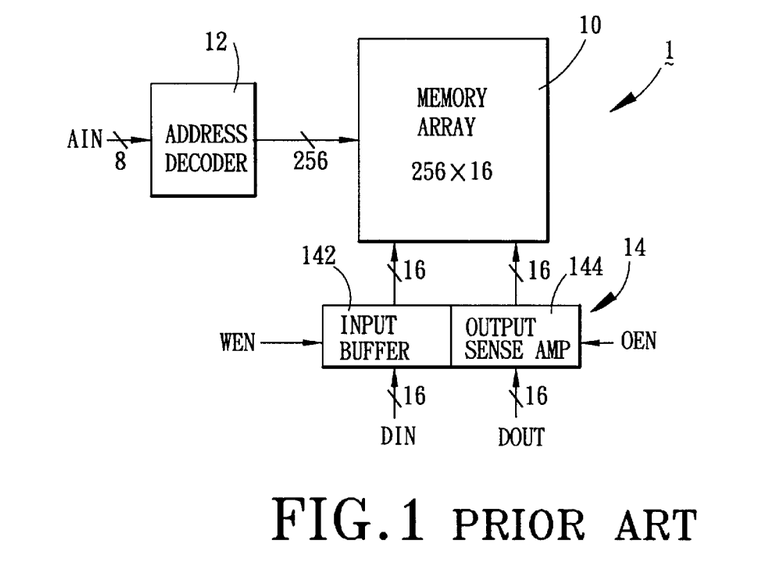
FIG. 1 is a schematic circuit block diagram illustrating a conventional memory device.

FIG. 1 is a schematic circuit block diagram illustrating a conventional memory device 1. In general, the memory device 1 comprises a memory array 10, an address decoder 12, and an input/output (I/O) circuit 14 that includes an input buffer portion 142 and an output sense amplifier portion 144. For convenience of explanation, a memory array 10 having a configuration of 256 words by 16 bits is taken as an example. Therefore, the address bus (AIN) has eight bits, which are decoded by the address decoder 12 to become 256 address select signals for addressing the 256 word lines of the memory array 10, respectively. The input buffer portion 142 has sixteen bit writing units, each of which passes an input data bit of a 16-bit input data bus (DIN) to the corresponding bit line of the memory array 10 under an asserted write enable (WEN) signal. The output sense amplifier portion 144 has sixteen bit sensing units, each of which senses an output data bit of the corresponding one of the bit lines of the memory array 10 and drives the corresponding output data line of a 16-bit output data bus (DOUT) under an asserted output enable (OEN) signal. In the conventional memory array 10, the sixteen bits of one word are simultaneously addressed for simultaneous writing under a common WEN signal, and for simultaneous reading under a common OEN signal.

For a single-port memory device as indicated in FIG. 1, the bit lines of the memory array 10 are shared by both the input buffer portion 142 and the output sense amplifier portion 144. However, a memory device having read and write ports that are separate is common in the art. One example of such a memory device is a dual-port memory commonly used as a FIFO memory. The dual-port memory needs separate addressing means, i.e. address bus and address decoder, for each port to address the word lines of the memory array.

Figure 2:
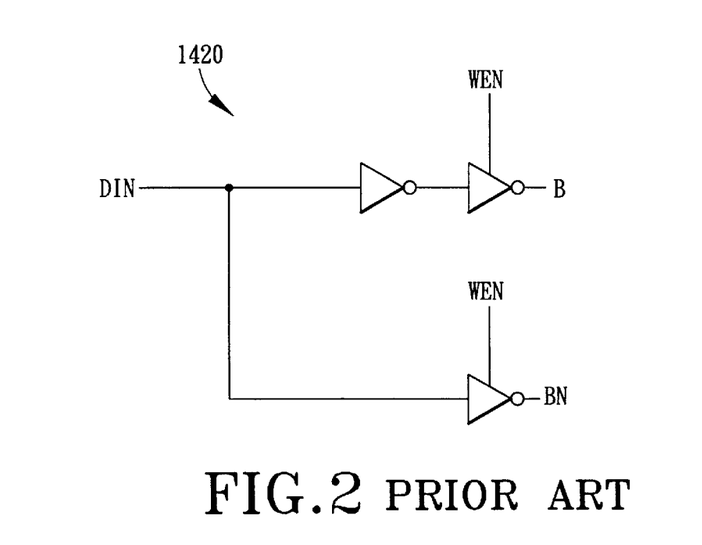
FIG. 2 is a schematic circuit diagram illustrating a bit writing unit of an input buffer portion in a conventional volatile memory device.

FIG. 2 is a schematic circuit diagram illustrating a bit writing unit 1420 of the input buffer portion in a conventional volatile memory device, such as DRAM or SRAM. The conventional volatile memory device usually has a complementary bit line structure, i.e. B, BN. The bit writing unit 1420 has a buffer input terminal connected to the input data bus (DIN), a buffer output terminal connected to the corresponding bit line (B, BN) of the memory array, and a buffer enable terminal to receive the write enable (WEN) signal. The input data bus (DIN) is connected to the corresponding bit line (B, BN) of the memory array when the WEN signal is asserted, and is disconnected therefrom when the WEN signal is not asserted.

Figure 3:
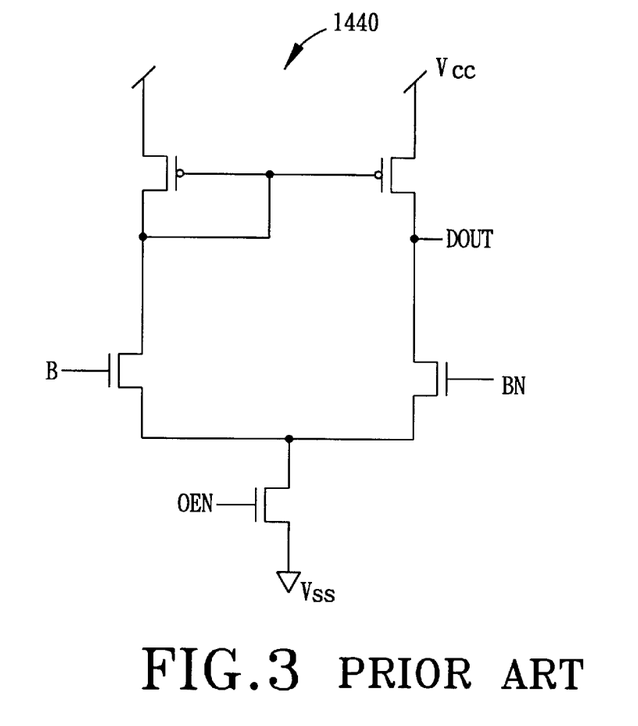
FIG. 3 is a schematic circuit diagram illustrating a bit sensing unit of an output sense amplifier portion in a conventional volatile memory device.

FIG. 3 is a schematic circuit diagram illustrating a bit sensing unit 1440 of the output sense amplifier portion in a conventional volatile memory device, such as DRAM or SRAM. The bit sensing unit 1440 has a sensing input terminal connected to the corresponding bit line (B, BN) of the memory array, a sensing output terminal connected to the output data bus (DOUT), and an output enable terminal to receive the output enable (OEN) signal. The bit lines (B, BN) of the memory array are sensed to drive the output data bus (DOUT) when the OEN signal is asserted.

Figure 4:
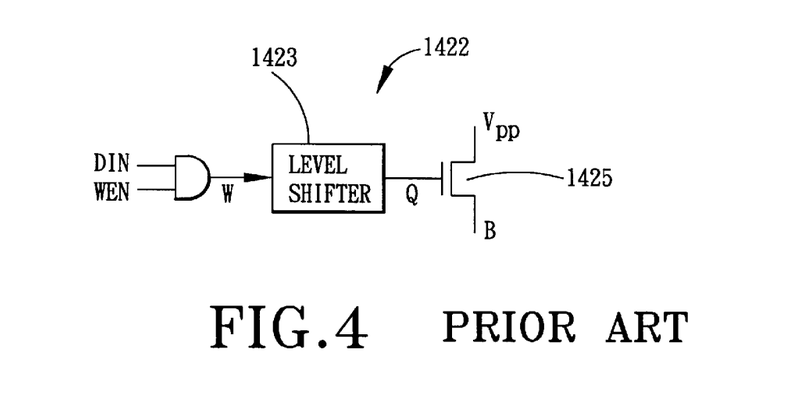
FIG. 4 is a schematic circuit diagram illustrating a bit writing unit of an input buffer portion in a conventional non-volatile memory device.

FIG. 4 is a schematic circuit diagram illustrating a bit writing unit 1422 of the input buffer portion in a conventional non-volatile memory device, such as EPROM, EEPROM and flash memory. The bit writing unit 1422 also has a buffer input terminal connected to the input data bus (DIN), a buffer output terminal connected to the corresponding bit line (B) of the memory array, and a buffer enable terminal to receive the write enable (WEN) signal. However, the conventional non-volatile memory device needs a high voltage (Vpp) to drive a write current to the bit line (B) during a write operation of one of the binary logic levels, such as logic "1". The write current is turned off during a write operation of the opposite binary logic level, such as logic "0". The level shifter 1423 acts to control turning-on and turning-off of an NMOS transistor 1425. W denotes a logic input to the level shifter 1423, which corresponds to a logic AND operation of the input data bit from the input data bus (DIN) and the WEN signal. Q denotes an output of the level shifter 1423, which is used to drive an NMOS transistor 1425. As such, the NMOS transistor 1425 conducts the write current from the high voltage source (Vpp) when the input data bus (DIN) is at logic "1" and the WEN signal is asserted, and resists the write current when otherwise.

Figure 5:
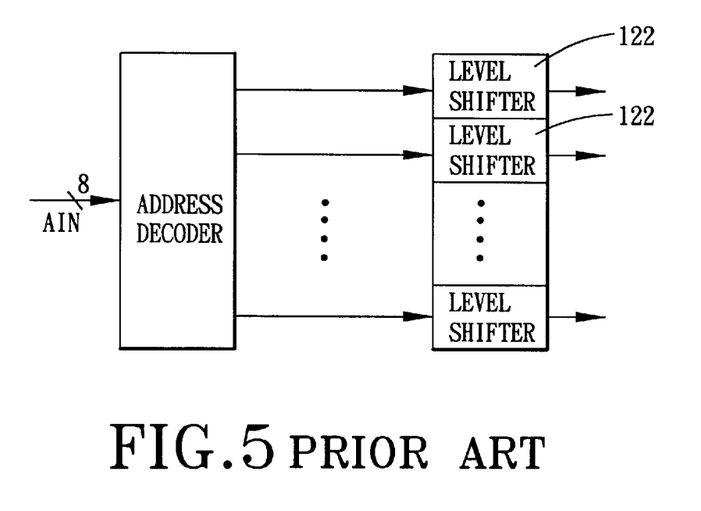
FIG. 5 is a schematic circuit block diagram illustrating an address decoder and level shifters in a conventional non-volatile memory device.

FIG. 5 is a schematic circuit block diagram illustrating an 8-to-256 address decoder 120 and 256 level shifters 122. A non-volatile memory device further needs a level shifter 122 associated with each word line of the memory array to apply different voltage levels to the corresponding word line during respective read and write operations. During a write operation, the word lines need a high voltage (Vpp) whereas, during a read operation, the word lines require a normal low voltage (Vcc).

Figure 6:
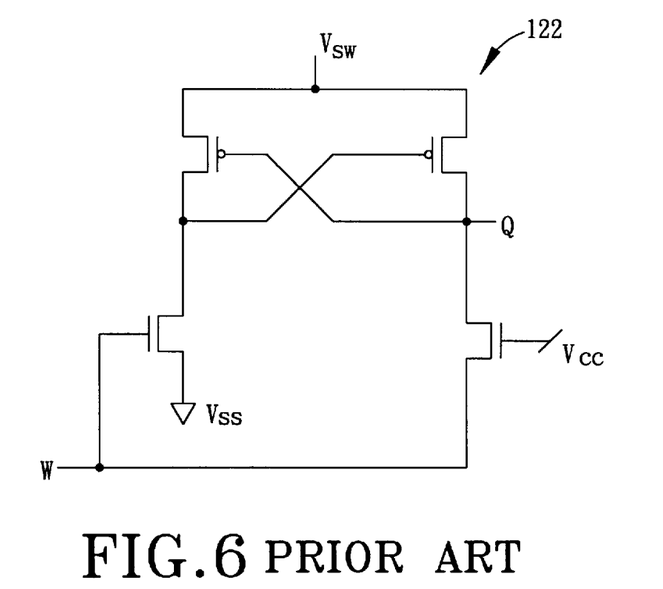
FIG. 6 is a schematic circuit diagram illustrating a level shifter used in a conventional non-volatile memory device.

FIG. 6 is a schematic circuit diagram illustrating the level shifter 122. Vsw is connected to a voltage switching circuit (not shown) that supplies the high voltage (Vpp) or the normal low voltage (Vcc) depending on whether the write operation or the read operation is to be performed. W denotes a logic input, while Q denotes an output.

For non-volatile memory devices, an erase mechanism (not shown) is further incorporated for erasing the programmed charges on cells of the memory array.

SUMMARY OF THE INVENTION

The object of the present invention is to provide a semiconductor memory device, either volatile or non-volatile, with a flexible configuration that eases reuse in the integration of a variety of system chips and, when fabricated as a stand-alone chip, that enhances flexibility in the design of a system board.

According to the present invention, a semiconductor memory device with a flexible configuration comprises an M-by-N memory array, a main address decoder, an input/output circuit, an auxiliary address decoder, a mode selector, an auxiliary address router, an input data router, and an output data router.

The memory array has a number M of complete words, each of the complete words having a number N of bits. The memory array further has M word lines to address the M complete words, and N bit lines to access the N bits. The number N has a number p of integer factors. The memory array is capable of being configured to operate in p different operating modes, where the bits of the complete words are rearranged into at least one sub-word formed as a bit group.

The main address decoder is connected to the word lines of the memory array and is adapted to be connected to a main address bus. The main address decoder is adapted to decode main address signals on the main address bus, and provide a number M of corresponding main address select signals to the word lines of the memory array, respectively.

The input/output circuit includes an input buffer portion and an output sense amplifier portion.

The input buffer portion has a number N of bit writing units. Each of the bit writing units has a buffer output terminal connected to a respective one of the bit lines of the memory array, a buffer input terminal, and a buffer enable terminal to control enabling of the bit writing unit for passing an input data bit at the buffer input terminal to the respective one of the bit lines via the buffer output terminal.

The output sense amplifier portion has a number N of bit sensing units. Each of the bit sensing units has a sensing input terminal connected to a respective one of the bit lines of the memory array, a sensing output terminal, and an output enable terminal adapted to receive an output enable signal to control enabling of the bit sensing unit for sensing an output data bit of the respective one of the bit lines and for providing the output data bit at the sensing output terminal in response to an asserted state of the output enable signal.

The auxiliary address decoder is adapted to be connected to an auxiliary address bus and is adapted to decode auxiliary address signals on the auxiliary address bus and generate a number N of corresponding auxiliary address select signals.

The mode selector generates mode control signals that correspond to a selected one of the different operating modes.

The auxiliary address router is connected to the auxiliary address decoder, the mode selector and the buffer enable terminals of the bit writing units of the input buffer portion. The auxiliary address router is adapted to receive a write enable signal and enables appropriate ones of the bit writing units, which are associated with the sub-word that is selected according to the auxiliary address select signals from the auxiliary address decoder and the mode control signals from the mode selector, in response to an asserted state of the write enable signal.

The input data router is connected to the mode selector and the buffer input terminals of the bit writing units of the input buffer portion. The input data router is adapted to be connected to input data lines of an N-bit input data bus so as to receive input data bits therefrom, and is adapted to route the input data bits from the input data lines that are selected according to the mode control signals to the appropriate ones of the bit writing units that are enabled by the auxiliary address router.

The output data router is connected to the auxiliary address decoder, the mode selector and the sensing output terminals of the bit sensing units of the output sense amplifier portion. The output data router is adapted to be connected to output data lines of an N-bit output data bus, and is adapted to route the output data bit at the sensing output terminal of appropriate ones of the bit sensing units, which are associated with the sub-word that is selected according to the auxiliary address select signals from the auxiliary address decoder and the mode control signals from the mode selector, to appropriate ones of the output data lines of the output data bus.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 7:
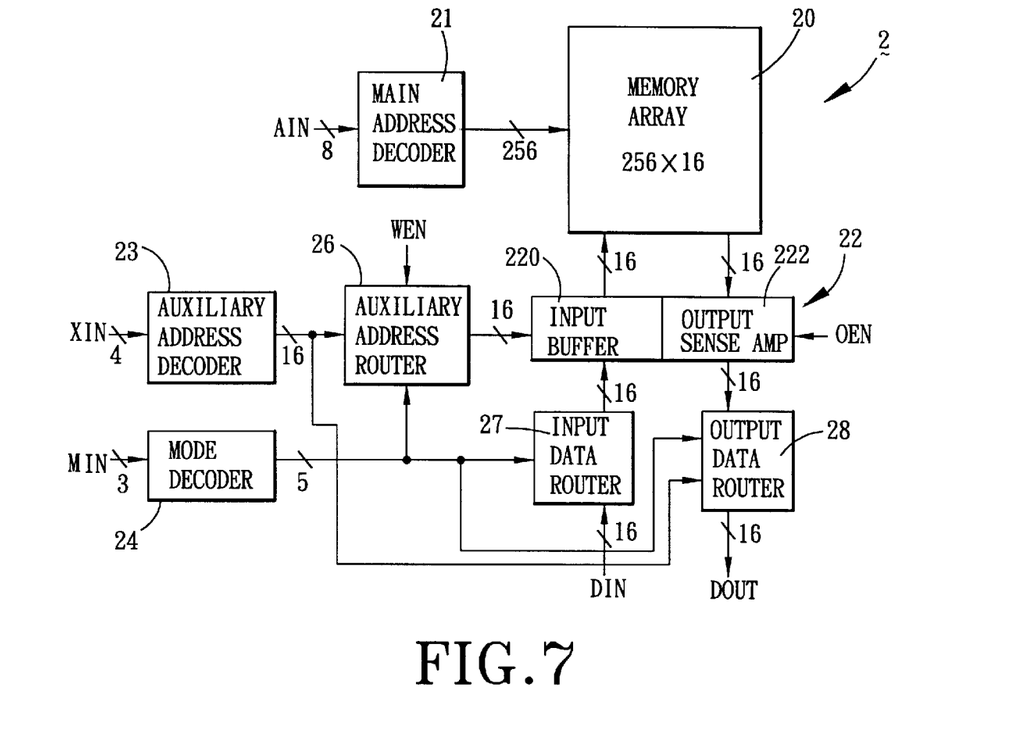
FIG. 7 is a schematic circuit block diagram illustrating the preferred embodiment of a semiconductor memory device according to the present invention.

Referring to FIG. 7, the preferred embodiment of a semiconductor memory device 2 according to the present invention is shown to comprise an M-by-N memory array 20, a main address decoder 21, an input/output (I/O) circuit 22 that includes an input buffer portion 220 and an output sense amplifier portion 222, an auxiliary address decoder 23, a mode selector or mode decoder 24, an auxiliary address router 26, an input data router 27 and an output data router 28.

The memory array 20 is conventional in construction and has a number M of complete words, each of the complete words having a number N of bits. The memory array 20 further has M word lines to address the M complete words, and N bit lines to access the N bits. The number N has a number p of integer factors. Unlike the memory array of conventional memory devices, the memory array 20 can be configured to operate in p different operating modes, where the bits of the complete words are rearranged into at least one sub-word formed as a bit group. In the preferred embodiment, the sub-words in the same operating mode have uniform bit lengths. The uniform bit lengths of the sub-words are different for the different operating modes.

For convenience of explanation, a memory array 20 having M=256 and N=16 is taken as an example. The integer factors of the number "16" include 1, 2, 4, 8 and 16. Thus, the memory array 20 can be configured to operate in five different operating modes. This will be described in greater detail in the succeeding paragraphs.

The main address decoder 21, which is conventional in construction, is connected to the word lines of the memory array 20 and is adapted to be connected to a main address bus (AIN). In this example, the main address bus (AIN) is an 8-bit address bus, and the main address decoder 21 is adapted to decode main address signals on the main address bus (AIN) and provide 256 corresponding main address select signals to the word lines of the memory array 20, respectively.

The input buffer portion 220 includes 16 bit-writing units (not shown). The bit writing units are conventional in construction and can be similar to the one shown in FIG. 2, in the case that the semiconductor memory device 2 is volatile, or the one shown in FIG. 4, in the case the semiconductor memory device 2 is non-volatile. Thus, each bit writing unit has a buffer output terminal connected to a respective one of the bit lines of the memory array 20, a buffer input terminal, and a buffer enable terminal to control enabling of the bit writing unit for passing an input data bit at the buffer input terminal to the respective one of the bit lines via the buffer output terminal.

The output sense amplifier portion 222 includes 16 bit-sensing units (not shown). The bit sensing units are conventional in construction and can be similar to the one shown in FIG. 3, in the case that the semiconductor memory device 2 is volatile. Thus, each bit sensing unit has a sensing input terminal connected to a respective one of the bit lines of the memory array 20, a sensing output terminal, and an output enable terminal adapted to receive an output enable (OEN) signal to control enabling of the bit sensing unit for sensing an output data bit of the respective one of the bit lines and for providing the output data bit at the sensing output terminal in response to an asserted state of the OEN signal.

In the illustrative example, the auxiliary address decoder 23 is adapted to be connected to a 4-bit auxiliary address bus (XIN), and is adapted to decode auxiliary address signals on the auxiliary address bus (XIN) and generate 16 corresponding auxiliary address select signals X0–X15.

The mode decoder 24 generates mode control signals that correspond to a selected one of the different operating modes. Particularly, in this example, the mode decoder 24 is adapted to receive a 3-bit mode select signal (MIN) and to decode the mode select signal (MIN) to obtain five mode control signals M1–M5.

The auxiliary address router 26 is connected to the auxiliary address decoder 23, the mode decoder 24, and the buffer enable terminals of the bit writing units of the input buffer portion 220. The auxiliary address router 26 is adapted to receive a write enable (WEN) signal, and enables appropriate ones of the bit writing units which are associated with the sub-word of the memory array 20 that is selected according to the auxiliary address select signals X0–X15 and the mode control signals M1–M5 in response to an asserted state of the WEN signal.

The input data router 27 is connected to the mode decoder 24 and the buffer input terminals of the bit writing units of the input buffer portion 220. The input data router 27 is further adapted to be connected to input data lines of a 16-bit input data bus (DIN) so as to receive input data bits therefrom. The input data router 27 is adapted to route the input data bits from the input data lines that are selected according to the mode control signals M1–M5 to the appropriate ones of the bit writing units that are enabled by the auxiliary address router 26.

The output data router 28 is connected to the auxiliary address decoder 23, the mode decoder 24, and the sensing output terminals of the bit sensing units of the output sense amplifier portion 222. The output data router 28 is further adapted to be connected to output data lines of a 16-bit output data bus (DOUT) The output data router 28 is adapted to route the output data bit at the sensing output terminal of appropriate ones of the bit sensing units, which are associated with the sub-word that is selected according to the mode control signals M1–M5 and the auxiliary address select signals X0–X15, to appropriate ones of the output data lines of the output data bus (DOUT).

In the above example, the five operating modes of the memory array 20 are as follows:

M1: The memory array 20 is configured to have 4096 sub-words, each of which is one bit long. Thus, the configuration of the memory device 2 becomes 4K×1. All four bits of the auxiliary address bus (XIN) are valid, and cooperate with the 8-bit main address bus (AIN) to form a 12-bit address bus for decoding the addresses of the 4096 sub-words. Only the least significant bits (LSB) of the input data lines and the output data lines of the input data bus (DIN) and the output data bus (DOUT) are valid such that each of the input data bus (DIN) and the output data bus (DOUT) acts as a one-bit data bus.

M2: The memory array 20 is configured to have 2048 sub-words, each of which is two bits long. Thus, the configuration of the memory device 2 becomes 2K×2. Only the three least significant bits (LSB) of the 4-bit auxiliary address bus (XIN) are valid, and cooperate with the 8-bit main address bus (AIN) to form an 11-bit address bus for decoding the addresses of the 2048 sub-words. Only the two least significant bits (LSB) of the input data lines and the output data lines of the input data bus (DIN) and the output data bus (DOUT) are valid such that each of the input data bus (DIN) and the output data bus (DOUT) acts as a two-bit data bus.

M3: The memory array 20 is configured to have 1024 sub-words, each of which is four bits long. Thus, the configuration of the memory device 2 becomes 1K×4. Only the two least significant bits (LSB) of the 4-bit auxiliary address bus (XIN) are valid, and cooperate with the 8-bit main address bus (AIN) to form a 10-bit address bus for decoding the addresses of the 1024 sub-words. Only the four least significant bits (LSB) of the input data lines and the output data lines of the input data bus (DIN) and the output data bus (DOUT) are valid such that each of the input data bus (DIN) and the output data bus (DOUT) acts as a four-bit data bus.

M4: The memory array 20 is configured to have 512 sub-words, each of which is eight bits long. Thus, the configuration of the memory device 2 becomes 512×8. Only the least significant bit (LSB) of the 4-bit auxiliary address bus (XIN) is valid, and cooperates with the 8-bit main address bus (AIN) to form a 9-bit address bus for decoding the addresses of the 512 sub-words. Only the eight least significant bits (LSB) of the input data lines and the output data lines of the input data bus (DIN) and the output data bus (DOUT) are valid such that each of the input data bus (DIN) and the output data bus (DOUT) acts as an eight-bit data bus.

M5: The memory array 20 is configured to have 256 words, each of which is 16 bits long. Thus, the configuration of the memory device 2 is 256×16. The 4-bit auxiliary address bus (XIN) is invalid, and only the 8-bit main address bus (AIN) is used for decoding the 256 word line addresses. All sixteen input and output data lines of the input data bus (DIN) and the output data bus (DOUT) are valid at this time.

Figure 8:
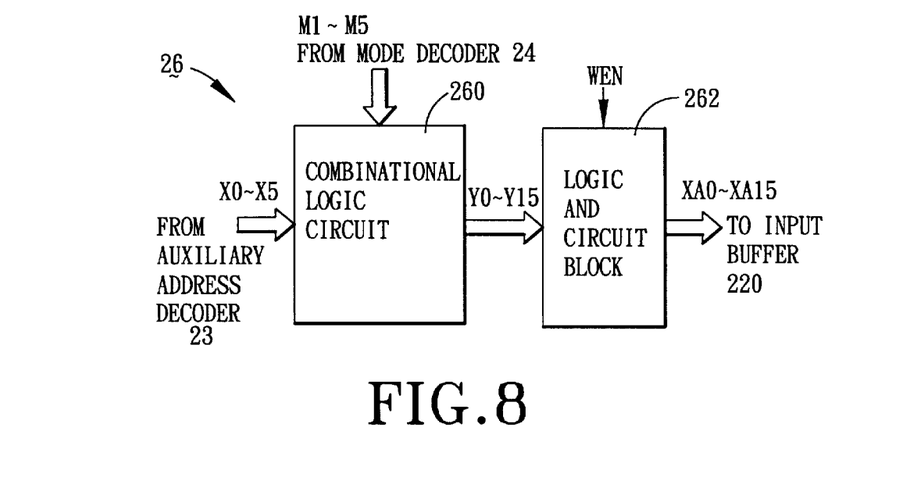
FIG. 8 is a schematic circuit block diagram illustrating an auxiliary address router of the preferred embodiment.

Referring to FIG. 8, the auxiliary address router 26 includes a combinational logic circuit 260 and a logic AND circuit block 262. The combinational logic circuit 260 is connected to the auxiliary address decoder 23 and the mode decoder 24, and performs logic operations on the mode control signals M1–M5 and the auxiliary address select signals X0–X5 according to a predetermined first set of Boolean equations. In this example, the combinational logic circuit 260 generates sixteen buffer select outputs Y0–Y15 according to the following Boolean equations:

$Y0 = X0$ $Y1 = M1*X1 + M2*X0 + M3*X0 + M4*X0 + M5*X0$ $Y2 = M1*X2 + M2*X1 + M3*X0 + M4*X0 + M5*X0$ $Y3 = M1*X3 + M2*X1 + M3*X0 + M4*X0 + M5*X0$ $Y4 = M1*X4 + M2*X2 + M3*X1 + M4*X0 + M5*X0$ $Y5 = M1*X5 + M2*X2 + M3*X1 + M4*X0 + M5*X0$ $Y6 = M1*X6 + M2*X3 + M3*X1 + M4*X0 + M5*X0$ $Y7 = M1*X7 + M2*X3 + M3*X1 + M4*X0 + M5*X0$ $Y8 = M1*X8 + M2*X4 + M3*X2 + M4*X1 + M5*X0$ $Y9 = M1*X9 + M2*X4 + M3*X2 + M4*X1 + M5*X0$ $Y10 = M1*X10 + M2*X5 + M3*X2 + M4*X1 + M5*X0$ $Y11 = M1*X11 + M2*X5 + M3*X2 + M4*X1 + M5*X0$ $Y12 = M1*X12 + M2*X6 + M3*X3 + M4*X1 + M5*X0$ $Y13 = M1*X13 + M2*X6 + M3*X3 + M4*X1 + M5*X0$ $Y14 = M1*X14 + M2*X7 + M3*X3 + M4*X1 + M5*X0$ $Y15 = M1*X15 + M2*X7 + M3*X3 + M4*X1 + M5*X0$

The logic AND circuit block 262 is connected to the combinational logic circuit 260 and the buffer enable terminals of the bit writing units of the input buffer portion 220. The logic AND circuit block 262 is adapted to receive the write enable (WEN) signal, and is adapted to perform a logic AND operation of the WEN signal with the buffer select outputs Y0–Y15 of the combinational logic circuit 260 to obtain sixteen buffer enable signals XA0–XA15 that are provided respectively to the buffer enable terminals of the bit writing units of the input buffer portion 220 for enabling the appropriate ones of the bit writing units.

Figure 9:
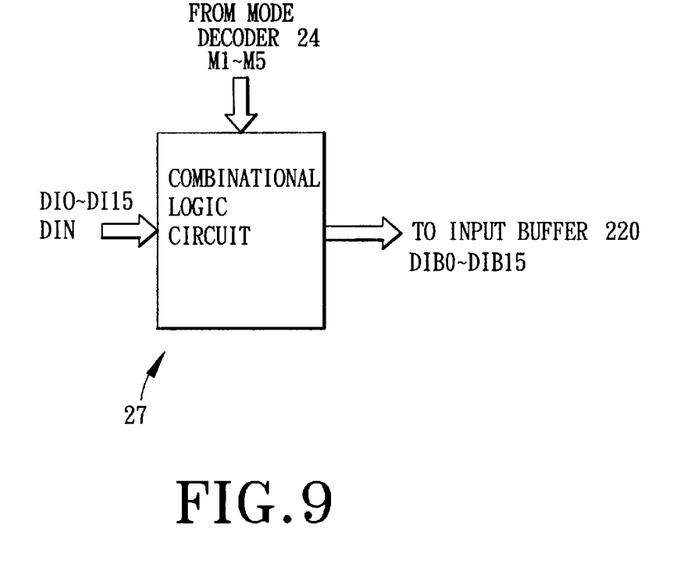
FIG. 9 illustrates an input data router of the preferred embodiment.

Referring to FIG. 9, the input data router 27 is shown to be in the form of a combinational logic circuit that is connected to the mode decoder 24 and the buffer input terminals DIB0–DIB15 of the bit writing units of the input buffer portion 220, and that is further adapted to be connected to the input data lines DI0–DI15 of the 16-bit input data bus (DIN). The combinational logic circuit is adapted to perform logic operations on the input data bits from the input data lines DI0–DI15 and the mode control signals M1–M5 according to the following predetermined second set of Boolean equations to route the input data bits to the appropriate ones of the bit writing units that are enabled by the auxiliary address router 26:

$DIB0 = DI0$ $DIB1 = M1*DI0 + M2*DI1 + M3*DI1 + M4*DI1 + M5*DI1$ $DIB2 = M1*DI0 + M2*DI0 + M3*DI2 + M4*DI2 + M5*DI2$ $DIB3 = M1*DI0 + M2*DI1 + M3*DI3 + M4*DI3 + M5*DI3$ $DIB4 = M1*DI0 + M2*DI0 + M3*DI0 + M4*DI4 + M5*DI4$ $DIB5 = M1*DI0 + M2*DI1 + M3*DI1 + M4*DI5 + M5*DI5$ $DIB6 = M1*DI0 + M2*DI0 + M3*DI2 + M4*DI6 + M5*DI6$ $DIB7 = M1*DI0 + M2*DI1 + M3*DI3 + M4*DI7 + M5*DI7$ $DIB8 = M1*DI0 + M2*DI0 + M3*DI0 + M4*DI0 + M5*DI8$ $DIB9 = M1*DI0 + M2*DI1 + M3*DI1 + M4*DI1 + M5*DI9$ $DIB10 = M1*DI0 + M2*DI0 + M3*DI2 + M4*DI2 + M5*DI10$ $DIB11 = M1*DI0 + M2*DI1 + M3*DI3 + M4*DI3 + M5*DI11$ $DIB12 = M1*DI0 + M2*DI0 + M3*DI0 + M4*DI4 + M5*DI12$ $DIB13 = M1*DI0 + M2*DI1 + M3*DI1 + M4*DI5 + M5*DI13$ $DIB14 = M1*DI0 + M2*DI0 + M3*DI2 + M4*DI6 + M5*DI14$ $DIB15 = M1*DI0 + M2*DI1 + M3*DI3 + M4*DI7 + M5*DI15$

Figure 10:
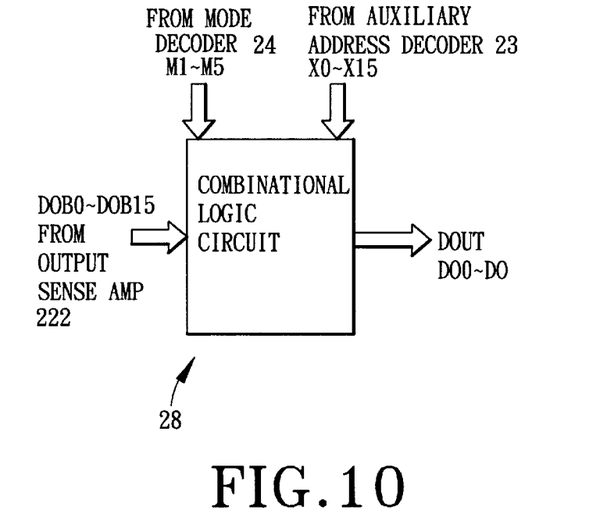
FIG. 10 illustrates an output data router of the preferred embodiment.

Referring to FIG. 10, the output data router 28 is shown to be in the form of a combinational logic circuit that is connected to the auxiliary address decoder 23, the mode decoder 24, and the sensing output terminals DOB0–DOB15 of the bit sensing units of the output sense amplifier portion 222, and that is further adapted to be connected to the output data lines DO0–DO15 of the 16-bit output data bus (DOUT). The combinational logic circuit, which acts as a multiplexer, is adapted to perform logic operations on the mode control signals M1–M5, the auxiliary address select signals X0–X15, and the output data bits at the sensing output terminals of the bit sensing units according to the following predetermined third set of Boolean equations to route the output data bits from the appropriate ones of the bit sensing units to the appropriate ones of the output data lines DO0–DO15 of the output data bus (DOUT):

a) when in mode M1, only the output data line DO0 is valid, $$DO0 = X0*DOB0 + X1*DOB1 + X2*DOB2 + X3*DOB3 +$$
$$X4*DOB4 + X5*DOB5 + X6*DOB6 + X7*DOB7 +$$
$$X8*DOB8 + X9*DOB9 + X10*DOB10 + X11*DOB11 +$$
$$X12*DOB12 + X13*DOB13 + X14*DOB14 + X15*DOB15$$

b) when in mode M2, only the output data lines DO0 and DO1 are valid, $$DO0 = X0*DOB0 + X1*DOB2 + X2*DOB4 + X3*DOB6 +$$
$$X4*DOB8 + X5*DOB10 + X6*DOB12 + X7*DOB14$$
$$DO1 = X0*DOB1 + X1*DOB3 + X2*DOB5 + X3*DOB7 +$$
$$X7*DOB9 + X5*DOB11 + X6*DOB13 + X7*DOB15$$

c) when in mode M3, only the output data lines DO0 to DO3 is valid, $$DO0 = X0*DOB0 + X1*DOB4 + X2*DOB8 + X3*DOB12$$
$$DO1 = X0*DOB1 + X1*DOB5 + X2*DOB9 + X3*DOB13$$
$$DO2 = X0*DOB2 + X1*DOB6 + X2*DOB10 + X3*DOB14$$
$$DO3 = X0*DOB3 + X1*DOB7 + X2*DOB11 + X3*DOB15$$

d) when in mode M4, only the output data lines DO0 to DO7 are valid, $$DO0 = X0*DOB0 + X1*DOB8$$
$$DO1 = X0*DOB1 + X1*DOB9$$
$$DO2 = X0*DOB2 + X1*DOB10$$
$$DO3 = X0*DOB3 + X1*DOB11$$
$$DO4 = X0*DOB4 + X1*DOB12$$
$$DO5 = X0*DOB5 + X1*DOB13$$
$$DO6 = X0*DOB6 + X1*DOB14$$
$$DO7 = X0*DOB7 + X1*DOB15$$

e) when in mode M5, all of the output data lines DO0–DO15 are valid, $$DOn = X0*DOBn, \text{ where } n=0 \text{ to } 15.$$

It is noted that the auxiliary address select signals X0–X15 from the auxiliary address decoder 23, the buffer enable signals XA0–XA15 from the auxiliary address router 26, the input data lines DI0–DI15 of the input data bus (DIN), the output data lines DO0–DO15 of the output data bus (DOUT), the buffer input terminals DIB0–DIB15 of the bit writing units of the input buffer portion 220, and the bit sensing output terminals DOB0–DOB15 of the bit sensing units of the output sense amplifier portion 222 all correspond in number with the number N of bits in one complete word of the memory array 20.

As mentioned beforehand, the memory device 2 of the illustrative example is based on a 256-by-16 configured memory array 20. In general, the present invention is applicable to any memory array having M complete words and N bits in each complete word.

In view of the flexible configuration of the semiconductor memory device of this invention, reuse in the integration of a variety of system chips can be eased. In addition, when the semiconductor memory device of this invention is fabricated as a stand-alone chip, flexibility in the design of a system board can be enhanced. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A semiconductor memory device with a flexible configuration, comprising:
    an M-by-N memory array having a number M of complete words, each of said complete words having a number N of bits, said memory array further having M word lines to address said M complete words, and N bit lines to access said N bits, wherein the number N has a number p of integer factors, said memory array being capable of being configured to operate in p different operating modes, where said bits of said complete words are rearranged into at least one sub-word formed as a bit group;
    a main address decoder connected to said word lines of said memory array and adapted to be connected to a main address bus, said main address decoder being adapted to decode main address signals on the main address bus and provide a number M of corresponding main address select signals to said word lines of said memory array, respectively;
    an input/output circuit including
        an input buffer portion having a number N of bit writing units, each of said bit writing units having a buffer output terminal connected to a respective one of said bit lines of said memory array, a buffer input terminal, and a buffer enable terminal to control enabling of said bit writing unit for passing an input data bit at said buffer input terminal to the respective one of said bit lines via said buffer output terminal, and
        an output sense amplifier portion having a number N of bit sensing units, each of said bit sensing units having a sensing input terminal connected to a respective one of said bit lines of said memory array, a sensing output terminal, and an output enable terminal adapted to receive an output enable signal to control enabling of said bit sensing unit for sensing an output data bit of the respective one of said bit lines and for providing the output data bit at said sensing output terminal in response to an asserted state of the output enable signal;
    an auxiliary address decoder adapted to be connected to an auxiliary address bus and adapted to decode auxiliary address signals on the auxiliary address bus and generate a number N of corresponding auxiliary address select signals;
    a mode selector for generating mode control signals that correspond to a selected one of the different operating modes;
    an auxiliary address router connected to said auxiliary address decoder, said mode selector and said buffer enable terminals of said bit writing units of said input buffer portion, said auxiliary address router being adapted to receive a write enable signal and enabling appropriate ones of said bit writing units which are associated with said sub-word that is selected according to the auxiliary address select signals from said auxiliary address decoder and the mode control signals from said mode selector in response to an asserted state of the write enable signal;

an input data router connected to said mode selector and said buffer input terminals of said bit writing units of said input buffer portion, said input data router being adapted to be connected to input data lines of an N-bit input data bus so as to receive input data bits therefrom and being adapted to route the input data bits from the input data lines that are selected according to the mode control signals to said appropriate ones of said bit writing units that are enabled by said auxiliary address router; and an output data router connected to said auxiliary address decoder, said mode selector and said sensing output terminals of said bit sensing units of said output sense amplifier portion, said output data router being adapted to be connected to output data lines of an N-bit output data bus and being adapted to route the output data bit at said sensing output terminal of appropriate ones of said bit sensing units, which are associated with said sub-word that is selected according to the auxiliary address select signals from said auxiliary address decoder and the mode control signals from said mode selector, to appropriate ones of the output data lines of the output data bus.

2. The semiconductor memory device of claim 1, wherein said mode selector includes a mode decoder adapted to receive a mode select signal and to decode the mode select signal to obtain a number p of the mode control signals.

3. The semiconductor memory device of claim 1, wherein said auxiliary address router includes:

a combinational logic circuit connected to said auxiliary address decoder and said mode selector for performing logic operations on the auxiliary address select signals and the mode control signals according to a predetermined set of Boolean equations to obtain a number N of buffer select outputs; and a logic AND circuit block connected to said combinational logic circuit and said buffer enable terminals of said bit writing units of said input buffer portion, said logic AND circuit block being adapted to receive the write enable signal and being adapted to perform a logic AND operation of the write enable signal with the buffer select outputs of said combinational logic circuit to obtain a number N of buffer enable signals that are provided respectively to said buffer enable terminals of said bit writing units for enabling said appropriate ones of said bit writing units.

4. The semiconductor memory device of claim 1, wherein said input data router includes a combinational logic circuit connected to said mode selector and said buffer input terminals of said bit writing units of said input buffer portion, said combinational logic circuit being adapted to be connected to the input data lines of the N-bit input data bus, said combinational logic circuit being adapted to perform logic operations on the input data bits from the input data lines and the mode control signals according to a predetermined set of Boolean equations to route the input data bits to said appropriate ones of said bit writing units.

5. The semiconductor memory device of claim 1, wherein said output data router includes a combinational logic circuit connected to said auxiliary address decoder, said mode selector and said sensing output terminals of said bit sensing units of said output sense amplifier portion, said combinational logic circuit being adapted to be connected to the output data lines of the N-bit output data bus and being adapted to perform logic operations on the auxiliary address select signals, the mode control signals and the output data bits at said sensing output terminals of said bit sensing units according to a predetermined set of Boolean equations to route the output data bits from said appropriate ones of said bit sensing units to said appropriate ones of the output data lines of the output data bus.

6. The semiconductor memory device of claim 1, wherein said at least one sub-word in the same one of the operating modes has uniform bit length, the uniform bit length of said at least one sub-word being different for the different operating modes.

7. A semiconductor memory device with a flexible configuration, comprising:

an M-by-N memory array having a number M of complete words, each of said complete words having a number N of bits, said memory array further having M word lines to address said M complete words, and N bit lines to access said N bits, wherein the number N has a number p of integer factors, said memory array being capable of being configured to operate in p different operating modes, where said bits of said complete words are rearranged into at least one sub-word formed as a bit group;

a main address decoder connected to said word lines of said memory array and adapted to be connected to a main address bus, said main address decoder being adapted to decode main address signals on the main address bus and provide a number M of corresponding main address select signals to said word lines of said memory array, respectively;

an input/output circuit including an input buffer portion having a number N of bit writing units, each of said bit writing units having a buffer output terminal connected to a respective one of said bit lines of said memory array, a buffer input terminal, and a buffer enable terminal to control enabling of said bit writing unit for passing an input data bit at said buffer input terminal to the respective one of said bit lines via said buffer output terminal;

an auxiliary address decoder adapted to be connected to an auxiliary address bus and adapted to decode auxiliary address signals on the auxiliary address bus and generate a number N of corresponding auxiliary address select signals;

a mode selector for generating mode control signals that correspond to a selected one of the different operating modes;

an auxiliary address router connected to said auxiliary address decoder, said mode selector and said buffer enable terminals of said bit writing units of said input buffer portion, said auxiliary address router being adapted to receive a write enable signal and enabling appropriate ones of said bit writing units which are associated with said sub-word that is selected according to the auxiliary address select signals from said auxiliary address decoder and the mode control signals from said mode selector in response to an asserted state of the write enable signal; and an input data router connected to said mode selector and said buffer input terminals of said bit writing units of said input buffer portion, said input data router being adapted to be connected to input data lines of an N-bit input data bus so as to receive input data bits therefrom and being adapted to route the input data bits from the input data lines that are selected according to the mode control signals to said appropriate ones of said bit writing units that are enabled by said auxiliary address router.

8. The semiconductor memory device of claim 7, wherein said mode selector includes a mode decoder adapted to receive a mode select signal and to decode the mode select signal to obtain a number p of the mode control signals.

9. The semiconductor memory device of claim 7, wherein said auxiliary address router includes:

a combinational logic circuit connected to said auxiliary address decoder and said mode selector for performing logic operations on the auxiliary address select signals and the mode control signals according to a predetermined set of Boolean equations to obtain a number N of buffer select outputs; and a logic AND circuit block connected to said combinational logic circuit and said buffer enable terminals of said bit writing units of said input buffer portion, said logic AND circuit block being adapted to receive the write enable signal and being adapted to perform a logic AND operation of the write enable signal with the buffer select outputs of said combinational logic circuit to obtain a number N of buffer enable signals that are provided respectively to said buffer enable terminals of said bit writing units for enabling said appropriate ones of said bit writing units.

10. The semiconductor memory device of claim 7, wherein said input data router includes a combinational logic circuit connected to said mode selector and said buffer input terminals of said bit writing units of said input buffer portion, said combinational logic circuit being adapted to be connected to the input data lines of the N-bit input data bus, said combinational logic circuit being adapted to perform logic operations on the input data bits from the input data lines and the mode control signals according to a predetermined set of Boolean equations to route the input data bits to said appropriate ones of said bit writing units.

11. The semiconductor memory device of claim 7, wherein said at least one sub-word in the same one of the operating modes has uniform bit length, the uniform bit length of said at least one sub-word being different for the different operating modes.

12. A semiconductor memory device with a flexible configuration, comprising:

an M-by-N memory array having a number M of complete words, each of said complete words having a number N of bits, said memory array further having M word lines to address said M complete words, and N bit lines to access said N bits, wherein the number N has a number p of integer factors, said memory array being capable of being configured to operate in p different operating modes, where said bits of said complete words are rearranged into at least one sub-word formed as a bit group;

a main address decoder connected to said word lines of said memory array and adapted to be connected to a main address bus, said main address decoder being adapted to decode main address signals on the main address bus and provide a number M of corresponding main address select signals to said word lines of said memory array, respectively;

an input/output circuit including an output sense amplifier portion having a number N of bit sensing units, each of said bit sensing units having a sensing input terminal connected to a respective one of said bit lines of said memory array, a sensing output terminal, and an output enable terminal adapted to receive an output enable signal to control enabling of said bit sensing unit for sensing an output data bit of the respective one of said bit lines and for providing the output data bit at said sensing output terminal in response to an asserted state of the output enable signal;

an auxiliary address decoder adapted to be connected to an auxiliary address bus and adapted to decode auxiliary address signals on the auxiliary address bus and generate a number N of corresponding auxiliary address select signals;

a mode selector for generating mode control signals that correspond to a selected one of the different operating modes; and an output data router connected to said auxiliary address decoder, said mode selector and said sensing output terminals of said bit sensing units of said output sense amplifier portion, said output data router being adapted to be connected to output data lines of an N-bit output data bus and being adapted to route the output data bit at said sensing output terminal of appropriate ones of said bit sensing units, which are associated with said sub-word that is selected according to the auxiliary address select signals from said auxiliary address decoder and the mode control signals from said mode selector, to appropriate ones of the output data lines of the output data bus.

13. The semiconductor memory device of claim 12, wherein said mode selector includes a mode decoder adapted to receive a mode select signal and to decode the mode select signal to obtain a number p of the mode control signals.

14. The semiconductor memory device of claim 12, wherein said output data router includes a combinational logic circuit connected to said auxiliary address decoder, said mode selector and said sensing output terminals of said bit sensing units of said output sense amplifier portion, said combinational logic circuit being adapted to be connected to the output data lines of the N-bit output data bus and being adapted to perform logic operations on the auxiliary address select signals, the mode control signals and the output data bits at said sensing output terminals of said bit sensing units according to a predetermined set of Boolean equations to route the output data bits from said appropriate ones of said bit sensing units to said appropriate ones of the output data lines of the output data bus.

15. The semiconductor memory device of claim 12, wherein said at least one sub-word in the same one of the operating modes has uniform bit length, the uniform bit length of said at least one sub-word being different for the different operating modes.

* * * * *